`US008461891B1`

United States Patent
Fu et al.

(10) Patent No.: US 8,461,891 B1
(45) Date of Patent: *Jun. 11, 2013

(54) VOLTAGE COMPENSATED INTEGRATED CIRCUITS

(76) Inventors: Robert Fu, Cupertino, CA (US); Neal A. Osborn, Milpitas, CA (US); James B. Burr, Foster City, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/030,180

(22) Filed: Feb. 12, 2008

Related U.S. Application Data

(63) Continuation of application No. 10/866,494, filed on Jun. 10, 2004, now Pat. No. 7,329,928, which is a continuation of application No. 10/439,665, filed on May 16, 2003, now Pat. No. 6,831,494.

(51) Int. Cl.
*H03K 3/356* (2006.01)
(52) U.S. Cl.
USPC .......................................................... 327/211
(58) Field of Classification Search
USPC ................................................. 327/108, 211
See application file for complete search history.

(56) References Cited

U.S. PATENT DOCUMENTS

| | | | |
|---|---|---|---|
| 5,128,560 A | 7/1992 | Chern et al. | |
| 5,264,738 A | 11/1993 | Veendrick et al. | |
| 5,297,086 A | 3/1994 | Nasu et al. | |
| 5,467,038 A * | 11/1995 | Motley et al. | 327/185 |
| 5,677,650 A | 10/1997 | Kwasniewski et al. | |
| 5,726,997 A * | 3/1998 | Teene | 714/726 |
| 5,912,591 A * | 6/1999 | Yamada | 331/57 |
| 5,982,211 A * | 11/1999 | Ko | 327/202 |
| 6,031,403 A | 2/2000 | Gersbach | |
| 6,087,886 A | 7/2000 | Ko | |
| 6,097,113 A * | 8/2000 | Teraoka et al. | 307/125 |
| 6,154,100 A | 11/2000 | Okamoto | |
| 6,188,260 B1 | 2/2001 | Stotz et al. | |
| 6,377,090 B1 | 4/2002 | Bruno | |
| 6,492,846 B1 * | 12/2002 | Taguchi et al. | 327/112 |
| 6,538,471 B1 * | 3/2003 | Stan et al. | 326/46 |
| 6,621,318 B1 | 9/2003 | Burr | |
| 6,759,863 B2 | 7/2004 | Moore | |
| 6,831,494 B1 | 12/2004 | Fu et al. | |
| 2002/0038433 A1 | 3/2002 | Dalrymple et al. | |
| 2002/0079509 A1 | 6/2002 | Efland et al. | |
| 2006/0023378 A1 * | 2/2006 | Jacob | 361/56 |
| 2006/0033532 A1 * | 2/2006 | Watt | 326/87 |
| 2006/0290635 A1 * | 12/2006 | Fratti et al. | 345/98 |
| 2007/0024332 A1 * | 2/2007 | McLeod | 327/143 |
| 2008/0195169 A1 * | 8/2008 | Pinter et al. | 607/28 |

OTHER PUBLICATIONS

Notice of Allowance Mailed Aug. 5, 2004; Patent No. 6,831,494.
Non-Final Office Action Mailed Mar. 9, 2004; Patent No. 6,831,494.
Notice of Allowance Mailed Nov. 29, 2007; Patent No. 7,329,928.
Non-Final Office Action Mailed Jun. 14, 2007; Patent No. 7,329,928.
Non-Final Office Action Mailed Dec. 19, 2006; Patent No. 7,329,928.
Non-Final Office Action Mailed Mar. 15, 2006; Patent No. 7,329,928.
Non-Final Office Action Mailed Jul. 1, 2005; Patent No. 7,329,928.

* cited by examiner

*Primary Examiner* — Daniel Rojas

(57) ABSTRACT

A method and system of voltage compensated integrated circuits. Operating characteristics of integrated circuitry are enhanced by application of voltage compensation.

39 Claims, 4 Drawing Sheets

VOLTAGE COMPENSATED INTEGRATED CIRCUITS

CROSS REFERENCE TO RELATED APPLICATIONS

This patent application is a Continuation of U.S. patent application Ser. No. 10/866,494, now U.S. Pat. No. 7,329,928, filed Jun. 10, 2004, which is a Continuation of U.S. patent application Ser. No. 10/439,665, now U.S. Pat. No. 6,831,494, filed May 16, 2003, which are hereby incorporated by reference in their entirety.

FIELD OF THE INVENTION

Embodiments in accordance with the present invention relate to the design and operation of integrated circuits. Specifically, an inverter circuit and a ring oscillator circuit are disclosed in embodiments in accordance with the present invention.

BACKGROUND

Semiconductor devices, e.g., digital logic integrated circuits, are generally operated with a positive supply voltage. However, the characteristics of such circuitry, e.g., operating frequency, gate delay and the like, vary widely with changes in supply voltage.

SUMMARY OF THE INVENTION

A method and system of voltage compensated integrated circuits are disclosed. Specifically, a voltage compensated inverter circuit is disclosed in accordance with one embodiment of the present invention. Also, a voltage compensated ring oscillator circuit is disclosed in accordance with another embodiment of the present invention.

DETAILED DESCRIPTION OF THE INVENTION

Figure 1:
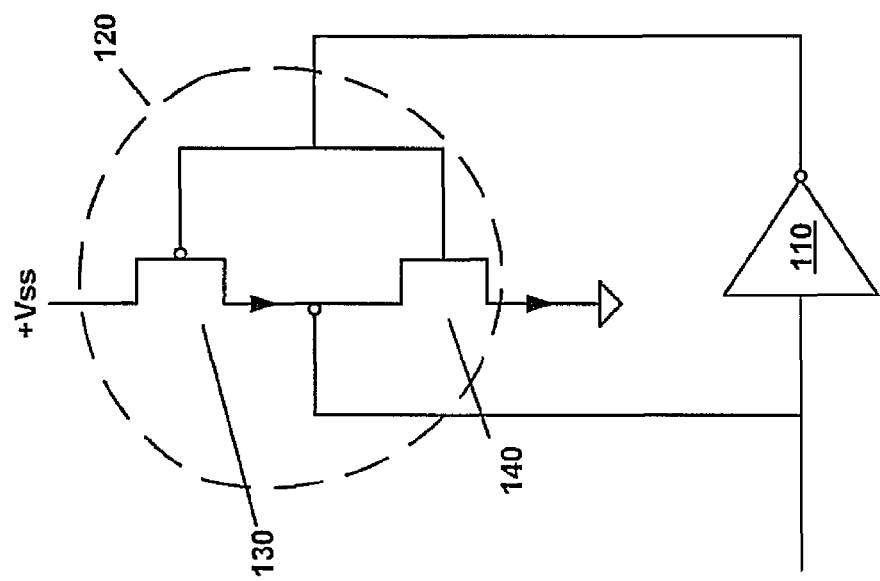
FIG. 1 illustrates a voltage compensated inverter circuit, in accordance with embodiments of the present invention.

In the following detailed description of the present invention, voltage compensated integrated circuits, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Voltage Compensated Integrated Circuits

Embodiments of the present invention are described in the context of design and operation of integrated semiconductors. More particularly, embodiments of the present invention relate to voltage compensated integrated circuits. It is appreciated, however, that elements of the present invention may be utilized in other areas of semiconductor operation.

Although the following description of embodiments in accordance with the present invention describes semiconductors formed in p-type materials, it is to be appreciated that symmetries with n-type materials are well known. For example, in general, exchanging p-type materials and processes with n-type materials and processes, and changing voltages from positive to negative can create symmetric structures and behaviors. Consequently, embodiments in accordance with the present invention are well suited to semiconductors formed in n-type materials, and such embodiments are considered within the scope of the present invention.

Variations in the operating of integrated circuits corresponding to changes in supply voltage are well known. For example, the same integrated circuit generally operates faster at a higher supply voltage than it does at a lower voltage.

It is oftentimes desirable to minimize such variations in operation of integrated circuits with respect to variations in supply voltage. For example, a design may desire for gate delay characteristics to remain relatively constant over a range of supply voltages. As another example, it may be advantageous to operate an integrated circuit during periods of unusually wide supply voltage fluctuations, for example, during a power supply ramp up or ramp down.

A typical power supply for an integrated circuit does not instantaneously switch from an "off" state, supplying no power, to an "on" state, supplying voltage and current levels within an operating tolerance range for the integrated circuit. There is usually a finite period of time during which the voltage and current levels smoothly transition from zero to rated levels. Frequently, bulk and distributed capacitance of a printed wiring board associated with the integrated circuit and power supply also influence such transitions. This period is generally known or described as a "ramp," "voltage ramp" or "ramp up" period. Similarly, when a power supply switches to an off state, voltage and current levels ramp "down."

It may be desirable to operate an integrated circuit during ramp up and ramp down periods. For example, during ramp down, a computer system, e.g., a computer powered by removable batteries, may desire to perform "housekeeping" tasks, e.g., to save information from volatile memory to non-volatile memory. By way of further example, it may be advantageous to operate certain circuits, e.g., a timing source, during a ramp up period.

In order to perform such tasks during ramp up or ramp down, it is desirable to utilize circuits with greater resistance to voltage variations than are available under the conventional art. It is further known to adjust the supply voltage of integrated circuits, e.g., a microprocessor, to optimize a relationship between performance requirements and power consumption of an integrated circuit. Such operations can be enabled, or a range of voltage adjustment can be extended, by utilizing circuits with greater resistance to voltage variations than are available under the conventional art.

FIG. 1 illustrates a voltage compensated inverter circuit 100, in accordance with embodiments of the present invention. Voltage compensated inverter circuit 100 comprises a conventional inverter circuit 110 and voltage compensating feedback circuit 120. Voltage compensating feedback circuit 120 is coupled to conventional inverter circuit 110.

Voltage compensating feedback circuit 120 comprises p-type transistor element 130 and n-type transistor element 140. It is to be appreciated that voltage compensating feedback circuit 120 forms an inverter circuit, and that the input of voltage compensating feedback circuit 120 is coupled to the output of conventional inverter circuit 110. Likewise, the output of voltage compensating feedback circuit 120 is coupled to the input of conventional inverter circuit 110.

Transistor elements 130 and 140 are constructed so as to have a higher threshold voltage than the transistor elements comprising conventional inverter circuit 110. In accordance with embodiments of the present invention, such a higher threshold voltage may be achieved by constructing transistor elements 130 and 140 as "thick gate" devices. It is appreciated that conventional inverter circuit 110 can be produced with conventional gate thicknesses as are standard to a particular logic family for a particular semiconductor process. Embodiments in accordance with the present invention are well suited to other techniques of adjusting threshold voltages of transistor devices, e.g., varying gate length and/or changing doping concentrations.

For example, for an exemplary 0.13 micron process, a standard gate can have a thickness of about 17 Angstroms, corresponding to a typical threshold voltage of about 250 mV, and begins to operate at about 350 mV. A "thick" gate can have a thickness of about 70 Angstroms, a typical threshold voltage of about 500 mV, and begin to operate at about 600 mV.

In general, semiconductor devices operate faster at higher supply voltages than at lower supply voltages. For example, conventional inverter circuit 110 will generally have a higher maximum frequency, faster switching time and lower gate delay at a higher supply voltage than at a lower supply voltage. Similarly, voltage compensating feedback circuit (inverter) 120 will generally have a higher maximum frequency, faster switching time and lower gate delay at a higher supply voltage than at a lower supply voltage.

When voltage compensating feedback circuit 120 is operating, it will oppose the operation of conventional inverter circuit 110. More specifically, voltage compensating feedback circuit 120 tends to lower the maximum frequency and switching time, and increase the gate delay of conventional inverter circuit 110.

Because voltage compensating feedback circuit 120 is constructed with devices having different voltage characteristics, e.g., threshold voltage, than the voltage characteristics of devices comprising conventional inverter circuit 110, the effects of voltage compensating feedback circuit 120 upon conventional inverter circuit 110 will vary with frequency. More specifically, voltage compensating feedback circuit 120 will oppose the operation of conventional inverter circuit 110 to a greater or lesser extent at different supply voltages.

For a low range of supply voltages, e.g., supply voltages below about 500 mV, voltage compensating feedback circuit 120 will have substantially no effect upon the operation of conventional inverter circuit 110. More specifically, the operating characteristics of voltage compensated inverter circuit 100 will be substantially dominated by the operating characteristics of conventional inverter circuit 110.

For a middle range of voltages, e.g., supply voltages between about 600 mV and about 1.4 V, voltage compensating feedback circuit 120 will affect the operation of conventional inverter circuit 110 to a varying degree. Within such a middle range of voltages, voltage compensating feedback circuit 120 becomes "stronger," or has a higher current output, and operates faster with increasing voltage. More specifically, the operating characteristics of voltage compensated inverter circuit 100 will be increasingly influenced by voltage compensating feedback circuit 120, corresponding with increasing supply voltage in this range.

It is to be appreciated that, because voltage compensating feedback circuit 120 is coupled in opposition to conventional inverter circuit 110, as voltage compensating feedback circuit 120 becomes "stronger" and faster with increasing supply voltage, this behavior opposes characteristics of conventional inverter circuit 110 to become faster with increasing supply voltage. As a beneficial consequence, voltage compensated inverter circuit 100 exhibits less dependence of operating characteristics on supply voltage than conventional inverter circuit 110 alone.

The size, shape and threshold voltages of transistor devices 130 and 140 to achieve a desired feedback characteristic can be determined through a process of simulation. The size, configuration and characteristics of conventional inverter circuit 110 are typically provided to a designer as standard elements of a logic family for a specific semiconductor process. Size and shape of transistor devices in integrated circuits are generally given as a ratio, e.g., "5/8." The first number specifies the width of the cell, e.g., "5," and the second number specifies the length of the cell, e.g., "8." The numbers typically indicate the dimension in microns. For an exemplary voltage compensated inverter circuit 100 constructed in a 0.13 micron process, conventional inverter circuit 110 can comprise a 10/8 p-type device (not shown) and a 5/8 n-type device (not shown). Device 130 can be a 5/1.6 thick gate p-type device, and device 140 can be a 2.5/1.6 thick gate n-type device.

Because feedback circuit 120 comprises transistor devices, e.g., transistor devices 130 and 140, having significant differences in construction from transistor devices comprising conventional inverter circuit 110, e.g., substantial differences in area and gate thickness, characteristics of feedback circuit 120 vary differently with supply voltage than do characteristics of conventional inverter circuit 110. More specifically, a frequency-voltage characteristic of feedback circuit 120 will typically have a different shape than a frequency-voltage characteristic of conventional inverter circuit 110.

For circuits intended to operate at supply voltages up to and within a middle range of voltages, e.g., supply voltages from 0 volts up to about 1.4 V in the present example, such differences between the shape of frequency-voltage characteristics for the two stages may be discounted.

However, above a certain supply voltage, for example about 1.4 volts, differences between the shape of frequency-voltage characteristics for the two stages can become significant. For such supply voltages, the frequency-voltage characteristics of voltage compensating feedback circuit 120 can "overpower" conventional inverter circuit 110, producing a slight decrease in maximum operating frequency with increasing supply voltage for the combined voltage compensated inverter circuit 100.

Figure 2:
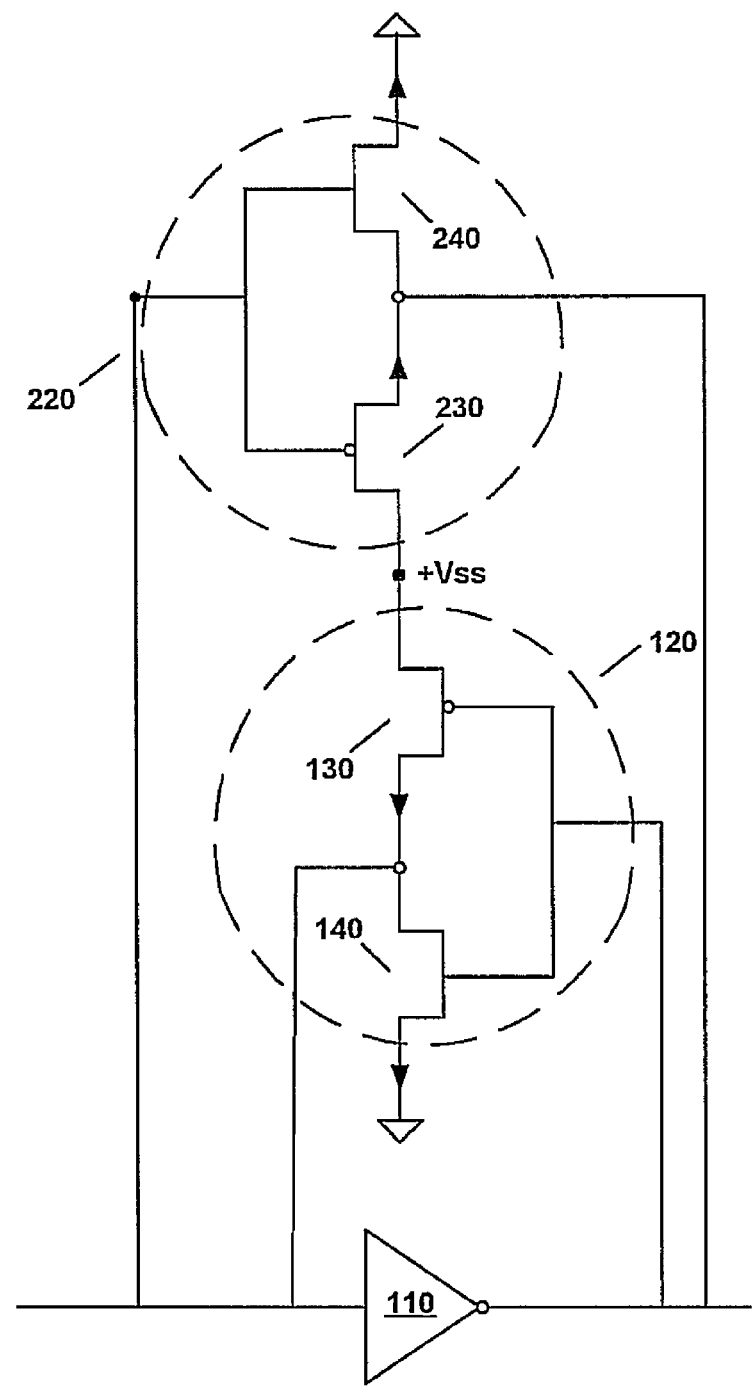
FIG. 2 illustrates a voltage compensated inverter circuit, in accordance with embodiments of the present invention.

In order to advantageously overcome such higher voltage characteristics of voltage compensated inverter circuit 100, an additional stage of feedback can be added. FIG. 2 illustrates a voltage compensated inverter circuit 200, in accordance with embodiments of the present invention. In addition to the elements of voltage compensated inverter circuit 100 (FIG. 1), voltage compensated inverter circuit 200 comprises an additional, or second feedback circuit 220. Second feedback circuit 220 comprises a p-type transistor device 230 and an n-type transistor device 240.

It is to be appreciated that second feedback circuit 220 forms an inverter circuit. It is to be further appreciated that second feedback circuit 220 is coupled to voltage compensating feedback circuit 120 so as to provide feedback to voltage compensating feedback circuit 120. More specifically, the output of voltage compensating feedback circuit 120 drives the input of second feedback circuit 220 and the output of second feedback circuit 220 drives the input of voltage compensating feedback circuit 120. Additionally, it is to be appreciated that second feedback circuit 220 actually reinforces conventional inverter circuit 110.

Transistor elements 230 and 240 are constructed so as to have a higher threshold voltage than the transistor elements comprising voltage compensating feedback circuit 120 (which comprises transistor elements with higher threshold voltages than the transistor elements comprising conventional inverter circuit 110). In accordance with embodiments of the present invention, such a higher threshold voltage may be achieved by constructing transistor elements 230 and 240 to comprise "thicker" gates than those of voltage compensating feedback circuit 120. Embodiments in accordance with the present invention are well suited to other techniques of adjusting threshold voltages of transistor devices, e.g., varying gate length and/or changing doping concentrations.

Second feedback circuit 220 serves to oppose the capability of voltage compensating feedback circuit 120 to overpower conventional inverter circuit 110 at higher supply voltages. As a beneficial consequence, voltage compensated inverter circuit 200 has more consistent operating characteristics, e.g., maximum frequency, switching and delay times, over a wider range of supply voltages in comparison with voltage compensated inverter circuit 100.

It is to be appreciated that additional feedback stages beyond the two shown in FIG. 2 can be added to improve the "flatness" of frequency response with respect to supply voltage of a voltage compensated circuit. Further, additional feedback stages can increase a range of supply voltages over which a desired flat frequency response to that supply voltage can be achieved. Embodiments in accordance with the present invention are well suited to a plurality of feedback stages.

A ring oscillator circuit generally comprises an odd number of inverter stages coupled in a ring configuration. It is to be appreciated that other inverting circuits, e.g., a NAND gate, are well suited to embodiments in accordance with embodiments of the present invention. A ring oscillator will oscillate, or "ring," at a frequency determined, in part, by switching delay times of the inverter stages and the number of inverter stages. Ring oscillators are a straight-forward source of oscillating clock signals in integrated circuits, and are an ideal frequency source for many applications. Since a ring oscillator does not require external components, e.g., a crystal, ceramic resonator or external resistors and/or external capacitors, ring oscillators can be implemented at lower cost and in a smaller size than many other clock sources.

However, ring oscillators are sometimes not used in integrated circuit designs because their frequency of operation is determined (in part) by the switching delay time of each inverter stage. As has been discussed previously, switching delay time of a conventional inverter stage varies with supply voltage. Consequently, the frequency of a conventional ring oscillator varies with supply voltage. Because a conventional ring oscillator frequently has many stages, the variation of switching delay time due to supply voltage changes for a single stage is magnified by the number of stages, producing great frequency variations in response to supply voltage changes for the entire oscillator.

Figure 3:
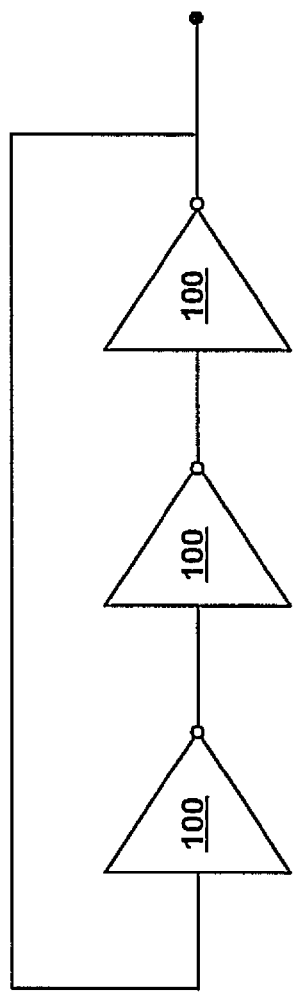
FIG. 3 illustrates a voltage compensated ring oscillator circuit, in accordance with embodiments of the present invention.

FIG. 3 illustrates a voltage compensated ring oscillator circuit 300, in accordance with embodiments of the present invention. Voltage compensated ring oscillator circuit 300 comprises three stages. Each stage is comprised of a voltage compensated inverter circuit 100 as described above. Ring oscillators constructed with other voltage compensated circuits, e.g., voltage compensated inverter circuit 200 or circuits comprising more stages of feedback, are well suited to embodiments in accordance with the present invention. The frequency of operating of a ring oscillator, e.g., voltage compensated ring oscillator circuit 300, depends on the delay inherent to each inverter stage and the number of stages provided in the ring.

Because the stages comprising voltage compensated ring oscillator circuit 300 have a stable frequency response over a range of supply voltages, voltage compensated ring oscillator circuit 300 exhibits a similar desirable stable frequency response over a range of supply voltages. Voltage compensated ring oscillator circuit 300 can be advantageously utilized to provide a stable frequency, e.g., for use as a microprocessor clock or to control a charge pump circuit, during a power supply ramp up and/or ramp down period. Further, voltage compensated ring oscillator circuit 300 can beneficially provide a stable frequency while a supply voltage of an integrated circuit, e.g., a microprocessor, is changed in order to optimize a relationship between performance requirements and power consumption of the integrated circuit.

Figure 4:
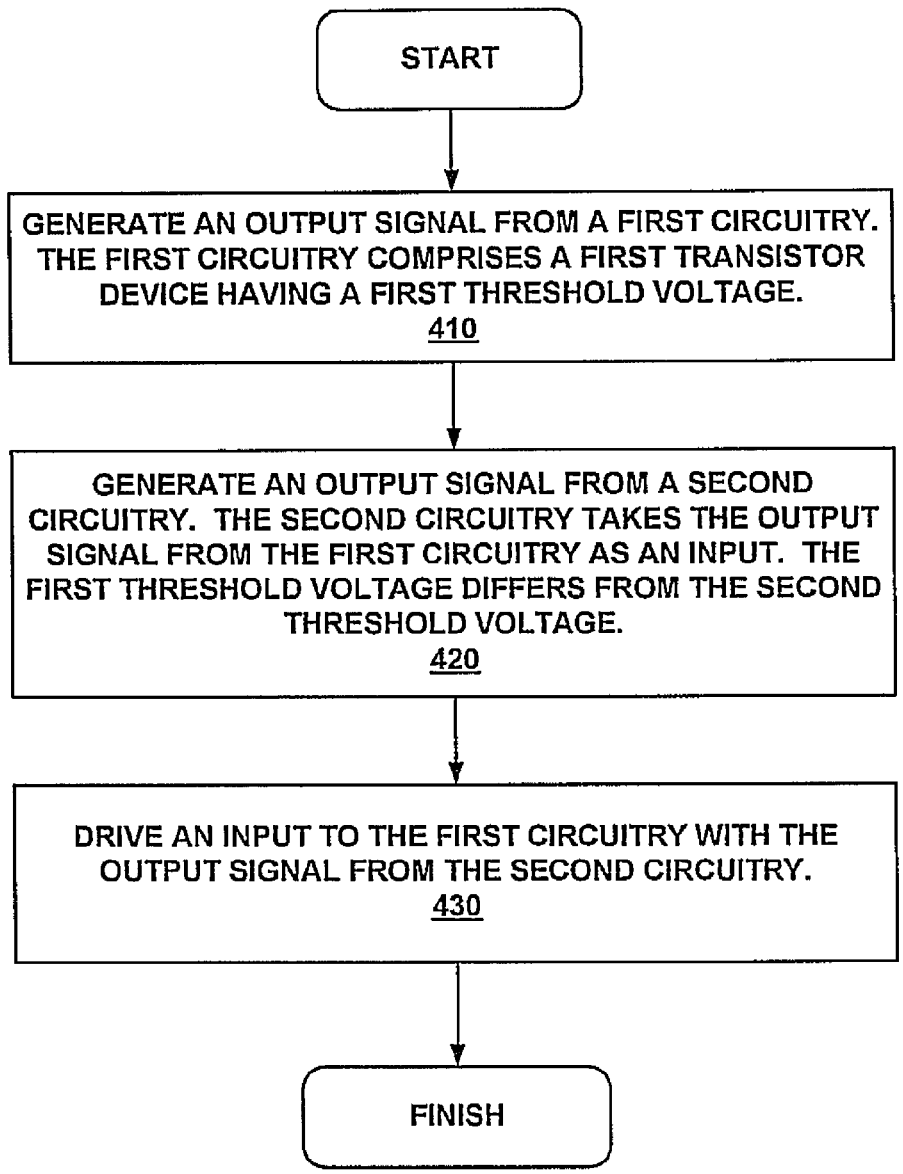
FIG. 4 illustrates a flow diagram of a method of operating an integrated circuit, in accordance with embodiments of the present invention.

FIG. 4 illustrates a flow diagram of a method 400 of operating an integrated circuit, in accordance with embodiments of the present invention. In block 410, an output signal from a first circuitry is generated. The first circuitry comprises a first transistor device having a first threshold voltage.

In block 420, an output signal from a second circuitry is generated. The second circuitry comprises a second transistor device having a second threshold voltage. The second circuitry takes the output signal from the first circuitry as an input. The first threshold voltage differs from the second threshold voltage.

In block 430, an input to the first circuitry is driven with the output signal from the second circuitry. In this novel manner, the second circuit provides a feedback signal to the first circuitry, enhancing the stability of characteristics, e.g., maximum frequency, switching and delay times, with respect to supply voltage of the combination of the two circuits in comparison to the characteristics of the first circuitry alone.

Embodiments in accordance with the present invention, voltage compensated integrated circuits, are thus described. While the present invention has been described in particular embodiments, it should be appreciated that the present invention should not be construed as limited by such embodiments, but rather construed according to the below claims.

What is claimed is:

1. A method comprising:
   providing a first circuit including components activated with a first magnitude threshold voltage; and
   coupling a second circuit to the first circuit in a feedback arrangement;
   wherein an output of said second circuit drives an input of said first circuit and does not drive other input circuitry; and
   wherein the second circuit includes components activated with a second magnitude threshold voltage which is greater in magnitude than the first threshold voltage.

2. The method as recited in claim 1 wherein the first circuit comprises an inverter including an input and an output.

3. The method as recited in claim 2 wherein the second circuit comprises a feedback inverter including an input and said output.

4. The method as recited in claim 3 wherein the input of the inverter is connected to the output of the feedback inverter, and wherein the output of the inverter is connected to the input of the feedback inverter.

5. A method comprising:
  connecting a second circuit to a first circuit in a first feedback arrangement, wherein the first circuit includes components activated with a first threshold voltage and the second circuit includes components activated with a second threshold voltage which is greater than the first threshold voltage; and
  connecting a third circuit to the second circuit in a second feedback arrangement, wherein the third circuit includes components activated with a third threshold voltage which is greater than the second threshold voltage.

6. The method as recited in claim 5 wherein the first circuit comprises an inverter including an input and an output.

7. The method as recited in claim 6 wherein the second circuit comprises a first feedback inverter including an input and an output.

8. The method as recited in claim 7 wherein the third circuit comprises a second feedback inverter including an input and an output.

9. The method as recited in claim 8 wherein the input of the inverter is coupled to the output of the first feedback inverter and is coupled to the input of the second feedback inverter.

10. The method as recited in claim 8 wherein the output of the inverter is connected to the input of the first feedback inverter and is connected to the output of the second feedback inverter.

11. The method as recited in claim 5 wherein the components of the first feedback inverter include a p-type transistor.

12. The method as recited in claim 11 wherein the components of the second feedback inverter include a p-type transistor.

13. The method as recited in claim 12 wherein the p-type transistor of the first feedback inverter is connected to the p-type transistor of the second feedback inverter.

14. The method as recited in claim 5 wherein the first, second, and third circuits are embodied within a microprocessor.

15. The method as recited in claim 5 wherein the first, second, and third circuits are within a computer system.

16. A device comprising:
  a first stage comprising components activated with at least a first threshold voltage and a second threshold voltage greater than the first threshold voltage;
  a second stage comprising components activated with at least a first threshold voltage and a second threshold voltage greater than the first threshold voltage; and
  a third stage comprising components activated with at least a first threshold voltage and a second threshold voltage greater than the first threshold voltage, wherein the first, second, and third stages are coupled in a ring arrangement,
  wherein said first and second threshold voltages are established by construction of said components.

17. The device as recited in claim 16 wherein each stage includes a first circuit and a second circuit coupled to the first circuit in a first feedback arrangement.

18. The device as recited in claim 17 wherein the first and second circuits comprise inverters.

19. The device as recited in claim 17 wherein each stage includes a third circuit coupled to the second circuit in a second feedback arrangement.

20. The device as recited in claim 19 wherein the third circuit comprises an inverter.

21. A means comprising:
  means for providing a first circuit including first circuit means activated with a first threshold voltage;
  means for connecting a second circuit to the first circuit in a first feedback arrangement, wherein the second circuit includes second circuit means activated with a second threshold voltage which is greater than the first threshold voltage; and
  means for connecting a third circuit to the second circuit in a second feedback arrangement, wherein the third circuit includes third circuit means activated with a third threshold voltage which is greater than the second threshold voltage.

22. The method as recited in claim 21 wherein the first circuit comprises inverter means including input means and output means.

23. The method as recited in claim 22 wherein the second circuit comprises a first feedback inverter means including input means and output means.

24. The method as recited in claim 23 wherein the third circuit comprises a second feedback inverter means including input means and output means.

25. The method as recited in claim 24 wherein the input means of the inverter means is coupled to the output means of the first feedback inverter means and is coupled to the input means of the second feedback inverter means.

26. The method as recited in claim 24 wherein the output means of the inverter means is coupled to the input means of the first feedback inverter means and is coupled to the output means of the second feedback inverter means.

27. The method as recited in claim 24 wherein the first feedback inverter means include p-type transistor means.

28. The method as recited in claim 24 wherein the second feedback inverter means include p-type transistor means.

29. The method as recited in claim 24 wherein the p-type transistor of the first feedback inverter means is coupled to the p-type transistor means of the second feedback inverter means.

30. An electronic circuit comprising:
  a first sub-circuit consisting of components configured with a first magnitude threshold voltage; and
  a second sub-circuit coupled to said first sub-circuit in a feedback arrangement, wherein the second circuit includes components configured with a second magnitude threshold voltage which is greater in magnitude than said first threshold voltage,
  wherein differences between said first and second threshold voltages are determined by fabrication differences of said components.

31. The electronic circuit of claim 30 wherein said differences between said first and second threshold voltages result from differences in gate thickness between said components.

32. The electronic circuit of claim 30 wherein differences between said first and second threshold voltages result from differences in gate length between said components.

33. The electronic circuit of claim 30 wherein differences between said first and second threshold voltages result from differences in dopant concentration between said components.

34. The electronic circuit of claim 30 wherein said components are free of configuration to receive a body biasing voltage.

35. An electronic circuit comprising:
  a first sub-circuit including components configured with a first threshold voltage; and
  a second sub-circuit coupled to said first sub-circuit in a feedback arrangement, wherein the second circuit includes components configured with a second threshold voltage which is greater in magnitude than said first threshold voltage, wherein said electronic circuit comprises a frequency-voltage characteristic that is more stable with respect to voltage over a range of frequencies than a frequency-voltage characteristic of said first sub-circuit in isolation.

36. A method comprising:

accessing a first signal at a first circuit input, wherein said first circuit comprises components activated with a first magnitude threshold voltage;

processing said first signal by said first circuit to produce a second signal;

accessing said second signal at a second circuit input, wherein said second circuit comprises components activated with a second magnitude threshold voltage greater than said first magnitude threshold voltage;

processing said second signal by said second circuit to produce a third signal; and directly connecting said third signal to said first signal.

37. The method of claim 36 further comprising:

accessing said first signal at a third circuit input, wherein said third circuit comprises components activated with a third magnitude threshold voltage greater than said second magnitude threshold voltage;

processing said first signal by said third circuit to produce a fourth signal at an output of said third circuit; and directly connecting said fourth signal to said second signal.

38. The method of claim 36 wherein the first circuit comprises an inverter.

39. The method of claim 36 wherein said second circuit comprises a frequency-voltage characteristic when combined in opposition with a frequency-voltage characteristic of said first circuit produces a frequency-voltage characteristic that is more stable with respect to voltage over a range of frequencies than said frequency-voltage characteristic of said first circuit.

* * * * *